United States Patent [19]

Baumgartner et al.

[11] Patent Number: 4,856,185
[45] Date of Patent: Aug. 15, 1989

[54] METHOD FOR FASTENING ELECTRONIC COMPONENTS TO A SUBSTRATE USING A FILM

[75] Inventors: Werner Baumgartner, Munich; Johannes Fellinger, Unterhaching, both of Fed. Rep. of Germany

[73] Assignee: Siemens Aktiengesellschaft, Berlin and Munich, Fed. Rep. of Germany

[21] Appl. No.: 132,009

[22] Filed: Dec. 11, 1987

[30] Foreign Application Priority Data

Dec. 22, 1986 [DE] Fed. Rep. of Germany ....... 3644044

[51] Int. Cl.$^4$ ............................................. H05K 13/04
[52] U.S. Cl. ...................................... 29/840; 228/248
[58] Field of Search ........................ 29/832, 840, 740; 228/180.2, 248, 263.12; 156/250

[56] References Cited

U.S. PATENT DOCUMENTS

| 4,342,606 | 8/1982 | Notton | 228/248 |
| 4,606,962 | 8/1986 | Reylek et al. | 428/148 |
| 4,746,055 | 5/1988 | Ingram et al. | 228/263.12 |
| 4,810,672 | 5/1989 | Schwartzbauer | 228/248 |

FOREIGN PATENT DOCUMENTS 0134623 3/1985 European Pat. Off. .
3414065 12/1985 Fed. Rep. of Germany .

*Primary Examiner*—Howard N. Goldberg
*Assistant Examiner*—Taylor J. Ross
*Attorney, Agent, or Firm*—Hill, Van Santen, Steadman & Simpson

[57] ABSTRACT

For fastening electronic components to substrates, a connecting layer having good adhesion and good electrical and thermal conductivity is manufactured by sintering from a metal powder layer. A paste formed of metal powder, such as a silver powder, and of a solvent, is processed into a solvent-free presintered film in a separate process. This film is punched in accordance with a cross-section of the component and is provided for fastening the component. In manufacturing the film, a specific solvent is employed, together with heating up rates of 5° to 30° C./Min and holding times of 0.5 to 5 minutes at a maximum temperature of 300° C. The fastening is carried out at temperature of at least 150° C. and at a minimum mechanical pressure of 30 N/cm$^2$. The use of a film speeds up the method and enables of sintering at low temperatures and, at the same time, at low mechanical pressure.

27 Claims, 1 Drawing Sheet

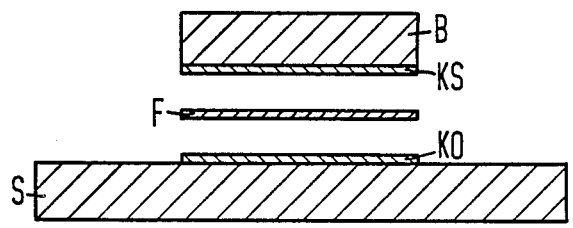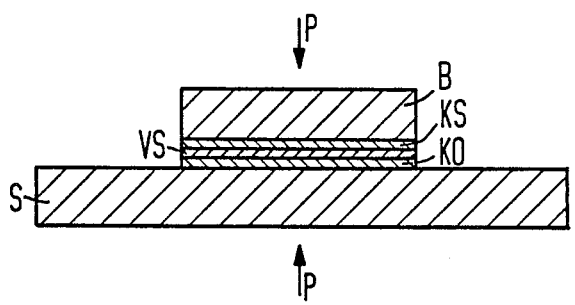

METHOD FOR FASTENING ELECTRONIC COMPONENTS TO A SUBSTRATE USING A FILM

BACKGROUND OF THE INVENTION

The invention is directed to a method for fastening electronic components to a substrate with a connecting layer sintering from a metal powder, and also relates to a film for implementation of the method and to a method for the manufacture of such a film.

Arrangements wherein components parts are secured to substrates and methods for manufacture are known from various publications. A connecting layer between the component part and substrate needed for fastening can be manufactured in various ways, but should always meet the same demands with respect to low electrical resistance, high thermal conductivity, and high adhesion.

German Published Application No. 34 14 065, incorporated herein by reference, discloses that the connecting layer can be exclusively manufactured from metal powder solidified by dry sintering. On the one hand, the contacting layer of the component, and on the other hand, the contact surface of the substrate, are also sintered. A bonding agent such as glass or glue is omitted. The manufacturing method of this arrangement provides that a paste formed of metal powder and of a solvent is applied in layer-like fashion to the contacting layer of the component and/or to the contact surface of the substrate. The component is placed onto the substrate or the paste, the solvent is completely driven out, and the overall arrangement is heated to sintering temperature for the formation of the connecting layer. It is thus fundamentally possible to degasify the paste in a vacuum before the component part is put in place, to subsequently pre-dry it, and to subsequently drive the solvent completely out after the component part is put in place. The sintering process is then subsequently carried out. The sintering temperature lie between 380° and 420° C. The mechanical pressure is set to a value between 80 and 90 N/cm$^2$.

German patent application, Ser. No. P 36 13 572.0, corresponding to U.S. Ser. No. 029,819 filed Mar. 25, 1987, now U.S. Pat. No. 4,810,672 incorporated herein by reference, discloses that a paste applied to the substrate and/or to the component before the component is put in place must be completely dried. The procedure is especially important given large-area components since a drying of the paste after the component has already been put in place leads to errors in the connecting layer. Disadvantages of this procedure are compensated by an extremely high mechanical pressure of at least 900 N/cm$^2$ during the sintering process.

SUMMARY OF THE INVENTION

An object of the invention is to create a method for fastening electronic components to a substrate with a connecting layer sintered of metal powder, whereby the thickness of this connecting layer can be varied within a broad range. Moreover, the manipulation during the method should be simplified such that the time for drying the paste is eliminated.

This object is achieved by a method for fastening electronic components to a substrate with a connecting layer sintered of metal powder wherein the metal powder is introduced between the component and substrate in the form of a pre-sintered film before the sintering process. The film is formed of a metal powder spread in planar fashion and held together by presintering. It is manufactured in a separate procedure, whereby:

(a) metal powder is mixed with a solvent to form a paste;
(b) the paste is applied to a foundation with a ductor mechanism;
(c) the solvent is driven out of the paste by applying heat;
(d) the particles of metal powder are at least partially sintered to one another by pre-sintering; and
(e) the film which has arisen in this way is lifted off from the foundation.

With the invention, the step of driving out the solvent from the paste is not performed during the actual fastening of the electronic component on the substrate.

As a result of manufacturing a film in an external process, the initial material for the connecting layer is present in the form of a solvent-free layer of metal powder particles, namely the film, which has received its mechanical strength by pre-sintering. The film which has arisen in this way in punched in accordance with the cross-sectional area of the electronic component and is employed in the method for fastening the electronic component to a substrate.

According to a preferred development of the invention, a mechanical pressure of at least 30 N/cm$^2$ is exerted on the component, film, and substrate during the sintering process. As a result of using a film, this relatively low pressure suffices in order to achieve good adhesion, and simultaneously preserves the component from excessively great mechanical stressing.

Furthermore, the use of a film in the described pressure sintering method permits the sintering process to be carried out at a minimal temperature of 150° C. set for this purpose.

The mechanical properties characteristic of the film result from the pre-sintering of the metal powder spread in planar fashion, so that the individual metal powder particles are coherent due to the reduction of the pore volume and due to neck formation. In correspondence with the degree of pre-sintering, or in correspondence with the energy that is introduced during the pre-sintering relative to the energy that must be supplied to the overall sintering process, the fine structure of the film is established and directly influences the method for fastening electronic components to a substrate.

In accordance with a further, preferred development of the invention, the film is formed of a precious metal or of a precious metal alloy. The employment of silver is especially beneficial.

In order to optimize the film with respect to its behavior during sintering, a metal powder formed of lamina-shaped metal powder particles is preferably employed, whereby the grain size lies at a maximum of 15 μm. This results in an especially good electrical and thermal conductivity of the connecting layer.

The manufacturing process of the film which is separated from the actual method for fastening electronic components on a substrate offers the possibility of predetermining the properties of the film (the initial material for the later provided connecting layer) within broad limits. This external process relieves the electronic components and the substrate from thermal stress, since a part of the heat quantity required for producing the connecting layer is already introduced udring the presintering and eliminates the time-consuming step of drying the paste from the actual method for manufacturing the connecting layer.

In a preferred embodiment of the method for manufacturing the film, a mixture of cyclo-hexanol and menthol is utilized as solvent, and it hs been determined that the best properties are obtained given a mixing in a weight ratio of 1:1. A solvent obtained in this way has the special advantage that it does not volatilize too quickly, i.e. the paste can be stored longer.

An optimum ratio between solvent and metal powder in the manufacture of the paste is established at 1:4.8. Very good physical properties of the paste with respect to workability are achieved with this value.

In a preferred embodiment of the invention, the finished film is processed in a calender after being stripped from the foundation. If necessary, the layer thickness of the film can be made uniform as a result thereof. Layer thicknesses of at least 5 μm can be fundamentally achieved.

When layer thicknesses of the paste between 10 and 100 μm can be manufactured given use of silk-screening methods, then the ductor method utilized here allows layer thicknesses between 10 and 500 μm to be obtained.

In a preferred embodiment of the invention, the heating-up rate when driving the solvent out of the paste amounts to between 5 and 30° C./Min. The optimal properaties of the film are achieved by a pre-sintering at a temperature of 220° C. The maximum temperature should not exceed 300° C. It has been shown that this temperture can be maintained over a holding time of 0.5 up to 5 minutes as a temperature maximum.

BRIEF DESCRIPTION OF THE DRAWINGS

FIG. 1 shows the position and arrangement of the individual parts before fastening the electronic component B to the substrate, and the film F; and FIG. 2 shows the same arrangement after full sintering, wherein the connecting layer VS has already been formed.

DESCRIPTION OF THE PREFERRED EMBODIMENTS

It may be seen from FIG. 1 that the substrate S is provided with the contact surface KO and that the electronic component B is provided with the contact layer KS. KO and KS, manufactured of material similar to the film F are shown exaggerated in size in comparison to the film F. As a rule, KS and KO lie in the range below 15 μm; the thickness of the film F can vary dependent on use and can amount to up to 250 μm or more. The film F has been manufactured from a metal powder-solvent paste in a separate procedure; has already been pre-sintered to become solvent-free; and has been punched in accordance with the cross-sectional area of the component B. In particular, a silver film is manufactured from a silver paste that was applied to a suitable foundation in layer thicknesses between 10 and 500 μm with a ductor mechanism. Polished silicon, glass, and quartz can be used as suitable foundations. A heating-up rate of about 20° C./Min. and a maximum temperature of 220° C. were set for driving the solvent out. This maximum temperature was maintained about two minutes. In this case, the solvent was a mixture of cyclohexanol and menthol in a weight ratio of 1:1. The ratio of solvent to silver powder amounted to 1:4.8.

FIG. 2 shows an arrangement corresponding to that of FIG. 1 wherein the component parts are pressed together by the mechanical pressure P, the film has already been converted into the connecting layer VS, and thus a fastening of the electronic component to the substrate S has been achieved.

Although various minor changes and modifications might be suggested to those skilled in the art, it will be understood that we wish to include within the claims of the patent warranted hereon all such changes and modifications as reasonably come within out contribution to the art.

We claim as our invention:

1. A method for fastening an electronic component to a substrate, comprising steps of:
   making a substantially solvent free connecting layer in the form of pre-sintered mechanically strong film formed from metal powder in a separate process prior to applying it to the component or substrate;
   placing the connectig layer between the component and substrate; and
   pressing the electronic component, connecting layer, and substrate together in a sintering process.

2. A method according to claim 1 including the step of pressing together the component, film, and substrate with a pressure of at least 30N/cm$^2$ during the sintering process.

3. A method according to claim 1 including the step of carrying out the sintering process at temperatures of at least 150° C.

4. A method according to claim 1 including the step of forming the film by spreading said metal powder in planar fashion and holding it together through the pre-sintering.

5. A method according to claim 4 including the step of forming the film of lamina-shaped metal powder particles whose grain size have a maximum of 15 μm.

6. A method according to claim 1 including the step of forming the film of a precious metal.

7. A method according to claim 6 wherein the film is formed of silver.

8. A method according to claim 1 including the step of forming the film of a precious metal alloy.

9. A method according to claim 1 including the steps of making the film by
   mixing metal powder with solvent to form a paste;
   applyihng the paste to a foundation with a ductor mechanism;
   driving the solvent out from the paste by applying heat;
   at least partially sintering the metal powder particles to one another by pre-sintering to create the film; and
   lifting the film from the foundation.

10. A method according to claim 9 including the step of employing as said solvent a mixture of cyclo-hexanol and methanol in a weight ratio within a range of 1:1 to 1:10.

11. A method according to claim 10 including the step of mixing the cyclo-hexanol and the methol in a weight ratio of 1:1.

12. A method according to claim 9 including the step of forming the paste from a mixture of the solvent and the metal powder in a weight ratio within limits of 1:4 to 1:6.

13. A method according to claim 12 wherein the weight ratio between the solvent and the metal powder amounts to 1:4.8.

14. A method according to claim 9 including the step of after-working the film with a calender.

15. A method according to claim 14 including the step of giving the film a uniform layer thickness of at least 5 μm.

16. A method according to claim 9 including the step of spreading the paste on with a ductor having a layer thickness between 10 and 500 μm.

17. A method according to claim 9 including the step of setting heating-up rates from 5 to 30° C./Min for driving the solvent out and for pre-sintering the metal powder.

18. A method according to claim 9 including the step of providing the temperature maximum at about 300° C.

19. A method according to claim 9 including the step of maintaining the holding time during which the maximally set temperature is maintained between 0.5 and 5 minutes.

20. A method for fastening an electronic component to a substrate, comprising:
manufacturing a connecting layer by providing a metal powder with solvent to form a paste;
applying the paste to a foundation to create a layer;
driving out the solvent with heat;
at least partially sintering the metal powder particles so as to create a pre-sintered film as said connecting layer;
cutting the pre-sintered film to a shape of a mounting area of said electronic component;
introducing the pre-sintered film connecting layer between the electronic component and substrate; and
pressing the electronic component, connecting layer, and substrate together in a sintering process.

21. A method for manufacturing a connecting layer for use in fastening an electronic component in a sintering process to a substrate wherein the connecting layer is provided between the substrate and electronic component, comprising:
mixing metal powder with solvent to form a paste;
applying the paste to a foundation;
driving out the solvent from the paste by applying heat;
at least partially sintering the metal powder particles to one another in a pre-sintering to create a film; and
removing the film from the foundation.

22. A method according to claim 21 wherein the film is cut to a desired shape corresponding to a mounting area of the electronic component with which it is to be used.

23. A method for fastening an electronic component to a substrate, comprising the steps of:
providing a connecting layer in the form of a presintered film formed from metal powder, said film being formed by spreading said metal powder in planar fashion and holding it together through pre-sintering;
introducing the connecting layer between the component and substrate; and
pressing the electronic component, connecting layer, and substrate together in a sintering process.

24. A method for fastening an electronic component to a substrate, comprising the steps of:
providing a connecting layer in the form of a presintered film formed from metal powder by mixing metal powder with solvent to form a paste, applying the paste to a foundation with a ductor mechanism, driving the solvent out from the paste by applying heat, at least partially sintering the metal powder particles to one another by pre-sintering to create the film, and lifting the film from the foundation;
introducing the connecting layer between the component and substrate; and
pressing the electronic component, connecting layer, and substrate together in a sintering process.

25. A method for fastening an electronic component to a substrate, comprising steps of:
making a connecting layer with a desired contour in the form of a pre-sintered film formed from metal powder with desired contour;
placing the connecting layer with desired contour between the component and substrate; and
pressing the electronic component, connecting layer, and substrate together in a sintering process.

26. The method of claim 25 wherein the pre-sintered film is stamped to provide the desired contour.

27. The method of claim 26 wherein the desired contour matches a contour of the component.

* * * * *